(12) United States Patent
Komori et al.

(10) Patent No.: US 11,478,790 B2
(45) Date of Patent: Oct. 25, 2022

(54) MICROFLUIDIC CHIP AND MICROFLUIDIC DEVICE

(71) Applicant: NOK CORPORATION, Tokyo (JP)

(72) Inventors: Takayuki Komori, Kanagawa (JP); Takahiro Hayashi, Kanagawa (JP)

(73) Assignee: NOK CORPORATION, Tokyo (JP)

( * ) Notice: Subject to any disclaimer, the term of this patent is extended or adjusted under 35 U.S.C. 154(b) by 298 days.

(21) Appl. No.: 16/609,258

(22) PCT Filed: Sep. 19, 2018

(86) PCT No.: PCT/JP2018/034615
§ 371 (c)(1),
(2) Date: Oct. 29, 2019

(87) PCT Pub. No.: WO2019/092989
PCT Pub. Date: May 16, 2019

(65) Prior Publication Data
US 2020/0061614 A1    Feb. 27, 2020

(30) Foreign Application Priority Data
Nov. 10, 2017   (JP) .............................. JP2017-217170

(51) Int. Cl.
*B01L 3/00*     (2006.01)
*B81B 1/00*     (2006.01)
(Continued)

(52) U.S. Cl.
CPC ........ *B01L 3/502715* (2013.01); *B81B 1/006* (2013.01); *B81C 1/00119* (2013.01);
(Continued)

(58) Field of Classification Search
CPC .. B01L 3/502715; B01L 3/5027; B01L 3/502; B01L 3/50; B01L 2300/041;
(Continued)

(56) References Cited

U.S. PATENT DOCUMENTS 8,404,192 B2 *   3/2013   Liu .................. G01N 35/00029
                                                        422/503
2004/0074084 A1  4/2004   Pieper et al.
(Continued)

FOREIGN PATENT DOCUMENTS

EP    1 797 955       6/2007
JP    2004-529749     9/2004
(Continued)

OTHER PUBLICATIONS

Extended European Search Report issued in 18 876 943.4, dated Aug. 26, 2020.
(Continued)

*Primary Examiner* — Christine T Mui
(74) *Attorney, Agent, or Firm* — Greenblum & Bernstein, P.L.C.

(57) ABSTRACT

A microfluidic chip includes a flow passage plate, a flat plate, and an annular seal. In the flow passage plate, a recess forming a flow passage for liquid and a communication hole communicating with the recess are formed. The flat plate is stacked on or under the flow passage plate to close the recess for defining the flow passage. In the flat plate, a communication through-hole communicating with the recess is formed. The annular seal is located on, or formed on, an outer surface of at least one of the flow passage plate and the flat plate, the annular seal surrounding at least one of the communication hole and the communication through-hole. The annular seal is made of an elastomer.

5 Claims, 7 Drawing Sheets

(51) Int. Cl.
  *B81C 1/00* (2006.01)
  *B29C 33/38* (2006.01)
  *B29C 45/26* (2006.01)
  *B29K 83/00* (2006.01)
  *B29L 31/00* (2006.01)

(52) U.S. Cl.
  CPC . *B01L 2300/041* (2013.01); *B01L 2300/0816* (2013.01); *B01L 2300/123* (2013.01); *B29C 33/3842* (2013.01); *B29C 45/2628* (2013.01); *B29K 2083/005* (2013.01); *B29K 2863/00* (2013.01); *B29L 2031/756* (2013.01); *B81B 2201/057* (2013.01); *B81B 2203/0338* (2013.01); *B81B 2203/0353* (2013.01); *B81C 2201/034* (2013.01)

(58) Field of Classification Search
  CPC ....... B01L 2300/0816; B01L 2300/123; B81B 1/006; B81B 1/00; B81B 2201/057; B81B 2203/0338; B81B 2203/0353
  USPC ......................................................... 422/503
  See application file for complete search history.

(56) References Cited

U.S. PATENT DOCUMENTS

| | | |
|---|---|---|
| 2005/0025677 A1 | 2/2005 | Oberbeck et al. |
| 2007/0048189 A1 | 3/2007 | Cox et al. |
| 2007/0120903 A1 | 5/2007 | Takagi |
| 2008/0017306 A1 | 1/2008 | Liu et al. |
| 2008/0038738 A1* | 2/2008 | Weigum .......... A61B 5/150099 435/6.12 |
| 2009/0270274 A1 | 10/2009 | Liu et al. |
| 2014/0363838 A1 | 12/2014 | Mcdevitt et al. |
| 2017/0348690 A1 | 12/2017 | Asogawa et al. |

FOREIGN PATENT DOCUMENTS

| | | |
|---|---|---|
| JP | 2005-507775 | 3/2005 |
| JP | 2007-092904 A | 4/2007 |
| JP | 2007-147456 | 6/2007 |
| JP | 2008-292379 | 12/2008 |
| JP | 2011-133402 | 7/2011 |
| JP | 2012-112511 A | 6/2012 |
| JP | 2013-208619 | 10/2013 |
| JP | 2013-208619 A | 10/2013 |
| JP | 2015-123012 | 7/2015 |
| WO | 2016/098722 A1 | 6/2016 |

OTHER PUBLICATIONS

Communication pursuant to Article 94(3) EPC issued in European Patent Application No. 18 876 943.4—1101 dated Sep. 23, 2021.
International Search Report issued in International Patent Application No. PCT/JP2018/034615, dated Dec. 25, 2018 (with English translation).
Japan Notice of Reasons for Refusal received in JP 2019-551902, dated Nov. 30, 2021.
Notice of Reasons for Refusal issued in Japanese Patent Application No. 2019-551902 dated Aug. 23, 2022 with machine English translation.

* cited by examiner

MICROFLUIDIC CHIP AND MICROFLUIDIC DEVICE

TECHNICAL FIELD

The present invention relates to microfluidic chips and to microfluidic devices.

BACKGROUND ART

Microfluidic devices are devices having microminiature flow passages in which liquids flow for analysis or for mixing liquids. In general, flow passages of microfluidic devices are designed to have low Reynolds numbers to allow laminar flow, so that controllability and reproducibility of flow is high. In addition, liquids are treated in microminiature spaces, it is possible to reduce the sizes of the devices, to reduce the amount of reagent used, and to shorten the reaction time (Non-patent Document 1). For these reasons, microfluidic devices have been used and studied in a wide range of fields.

In the manufacturing of microfluidic devices, the flow passages should be designed in view of the uses thereof. In flow passages, structures such as pillars, separation walls, flow-straightening plates, filters, and optically driven pumps may be formed.

When a multifunctional microfluidic device is formed of one two-dimensional chip, the area of the chip will be large. Furthermore, to satisfy the functions thereof, design of complicated flow passages is accordingly necessary, and it is not likely to be possible to use microfluidic devices designed for a particular application for other purposes.

Patent Document 1 discloses a biochip substrate manufactured by bonding multiple thin substrata, each having different flow passages. However, none of the above problems can be solved using this technique.

Patent Document 2 discloses forming a microfluidic chip device by preparing multiple modules having different functions, selecting some of the modules depending on the application, and combining them two-dimensionally. In this case, it is possible to form various microfluidic chip devices appropriate for the application.

PATENT DOCUMENTS

Patent Document 1: JP-A-2011-133402
Patent Document 2: JP-A-2015423012

NON-PATENT DOCUMENT

Non-patent Document 1: Yoshinobu Baba (supervisor), "*Nanoteku baio MEMS jidai no bunri ikeisoku gijutsu*" ("Technology for Separation and Measurement in the Nanotechnology and Bio-MEMS Era"), Japan, CMC Shuppan (CMC Publishing), February 2006

SUMMARY OF THE INVENTION

However, the technique disclosed in Patent Document 2 does not solve the problem of the total area of the microfluidic chip device being large. In addition, according to the technique disclosed in Patent Document 2, the flow passage of each module is formed of a tube, and connectors are used to connect the flow passages of different modules. Therefore, a large number of tubes and connectors are necessary.

Accordingly, the present invention provides a microfluidic chip having a simple configuration, enabling the easy formation of different microfluidic devices depending on various applications, and enabling minimizing the area of the formed microfluidic devices, and the present invention provides a microfluidic device including multiple microfluidic chips.

A microfluidic device according to an aspect of the present invention includes: a flow passage plate in which a recess forming a flow passage for liquid and a communication hole communicating with the recess are formed; a flat plate stacked on or under the flow passage plate to close the recess for defining the flow passage, a communication through-hole communicating with the recess is formed in the flat plate; and an annular seal made of an elastomer located on, or formed on, an outer surface of at least one of the flow passage plate and the flat plate, the annular seal surrounding at least one of the communication hole and the communication through-hole.

In accordance with this aspect, the flow passage of the microfluidic chip is formed easily, without using a tube, by combining the flow passage plate and the flat plate. Then, a microfluidic device can be formed by stacking multiple microfluidic chips, each having a different type of flow passage, one on the other, and by aligning the communication hole or the communication through-hole of one microfluidic chip with the communication hole or the communication through-hole of a neighboring microfluidic chip. By changing the laminated microfluidic chips depending on the application, a microfluidic device appropriate to the application can be formed easily. In the formed microfluidic device, each of the microfluidic chips has a different type of flow passage and has a different function. In the formed microfluidic device, multiple flow passages arranged in three dimensions are provided, and these microfluidic chips are stacked in the same two-dimensional region, so that the area of the microfluidic device can be minimized. The annular seal surrounding at least one of the communication hole and the communication through-hole is in contact with, and is compressed by, another microfluidic chip, and this allows flow of fluid between the microfluidic chips while preventing or reducing leakage of the fluid. Accordingly, connectors for connecting the flow passages of multiple microfluidic chips are not necessary.

A microfluidic device according to an aspect of the present invention includes: multiple microfluidic chips of the above aspect, the microfluidic chips including flow passages of different types, respectively, the multiple microfluidic chips stacked one on top of another, such that the communication hole or the communication through-hole of one of the microfluidic chips is aligned with the communication hole or the communication through-hole of a neighboring microfluidic chip. Here, "different type" means that at least one of the kind of liquid flowing through the flow passage, the shape, the position, and dimensions of the flow passage, and the structures arranged in the flow passage is different.

DESCRIPTION OF EMBODIMENTS

Hereinafter, with reference to the accompanying drawings, multiple embodiments according to the present invention will be described. It is noted that the drawings do not necessarily accurately show relative dimensional ratios of various elements in order that certain features of elements may be exaggerated.

Figure 1:
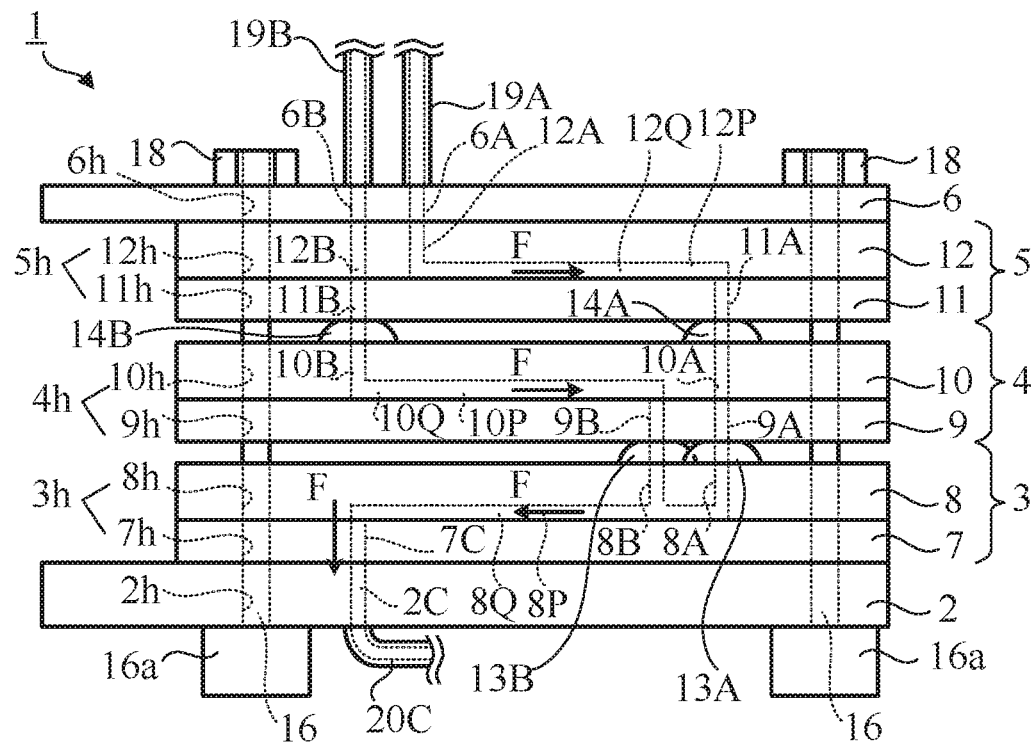
FIG. 1 is a front view showing a microfluidic device according to an embodiment of the present invention.

As shown in FIG. 1, a microfluidic device 1 according to the embodiment has a laminated structure including multiple flat plates stacked one on top of another, more specifically, a supporting flat plate 2, microfluidic chips 3, 4, and 5, and a protection flat plate 6.

Each of the microfluidic chips 3, 4, and 5 also has a laminated structure. Specifically, the microfluidic chip 3 includes a flat plate 7 and a flow passage plate 8 that is also a flat plate. The microfluidic chip 4 includes a flat plate 9 and a flow passage plate 10 that is also a flat plate. The microfluidic chip 5 includes a flat plate 11 and a flow passage plate 12 that is also a flat plate.

The supporting flat plate 2, the flat plates 7, 9, and 11, and the protection flat plate 6 are made of a transparent material, for example, acrylic resin or glass. The flow passage plates 8, 10, and 12 are made of a transparent elastomer, for example, silicone rubber, in which the principal component is polydimethylsiloxane (PDMS).

At four corners of the supporting flat plate 2, fixing through-holes 2h are formed. At four corners of each of the flat plates 7, 9, and 11, fixing through-holes 7h, 9h, or 11h are formed. At four corners of each of the flow passage plates 8, 10, and 12, fixing through-holes 8h, 10h, or 12h are formed. At four corners of the protection flat plate 6, fixing through-holes 6h are formed. The fixing through-holes 7h and 8h constitute the fixing through-holes 3h of the microfluidic chip 3. The fixing through-holes 9h and 10h constitute fixing through-holes 4h of the microfluidic chip 4. The fixing through-holes 11h and 12h constitute fixing through-holes 5h of the microfluidic chip 5.

As shown in FIG. 1, shanks of pins 16, each having a head 16a, are inserted through the fixing through-holes 2h, 3h, 4h, 5h, and 6h, and a nut 18 is attached, as a fixing tool, to a male thread section that is the top section of each of the pins 16. Thus, the supporting flat plate 2, the microfluidic chips 3, 4, and 5, and the protection flat plate 6, are unified. However, the fixing tools are not limited to the nuts 18, and other types of fixing tools may be used.

In this embodiment, the microfluidic chip 5 is used for supplying a type of liquid, and the microfluidic chip 4 is used for passing the liquid and for supplying another type of liquid, whereas the microfluidic chip 3 is used for mixing these liquids. For example, the microfluidic chip 5 may be used for supplying a liquid sample, whereas the microfluidic chip 4 may be used for passing the liquid sample and for supplying a reagent.

Figure 2:
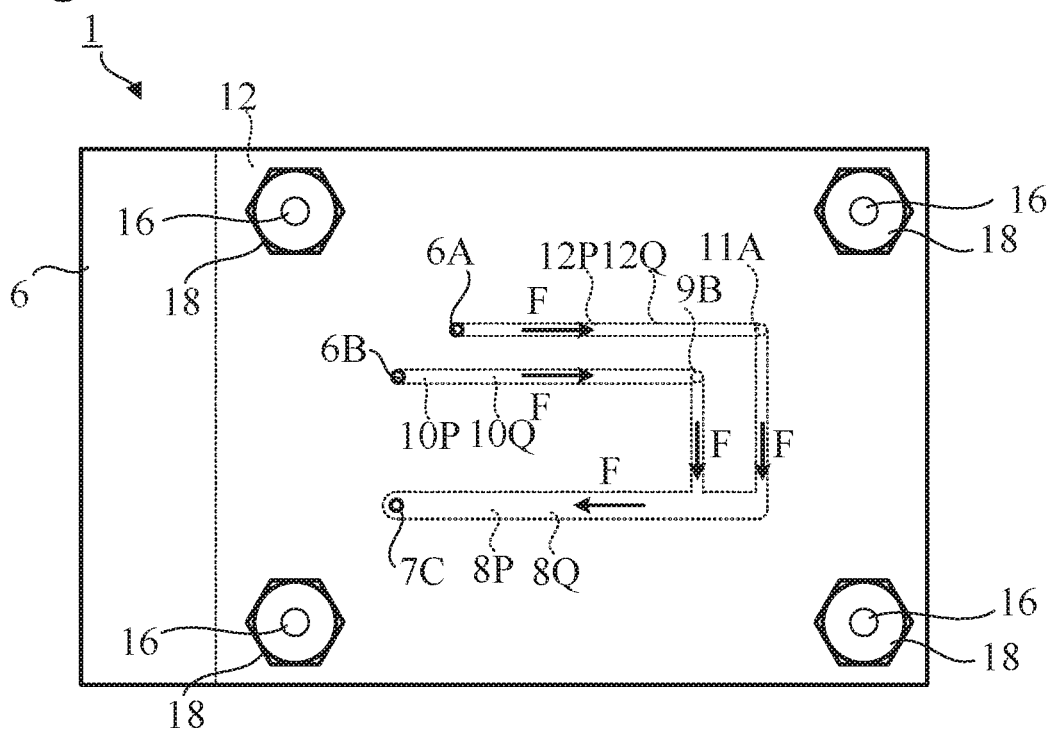
FIG. 2 is a plan view showing the microfluidic device of FIG. 1.

As shown in FIGS. 1 and 2, through-holes 6A and 6B that are introduction ports for different kinds of liquids are formed in the protection flat plate 6. The liquids are introduced into the through-holes 6A and 6B by injectors 19A and 19B for liquids (e.g., pipettes), respectively. The protection flat plate 6 is provided for protecting the flow passage plate 12 made of a soft elastomer. However, the protection flat plate 6 is not absolutely necessary. In FIGS. 1 and 2, the flow of liquid is denoted by arrows F.

Figure 3:
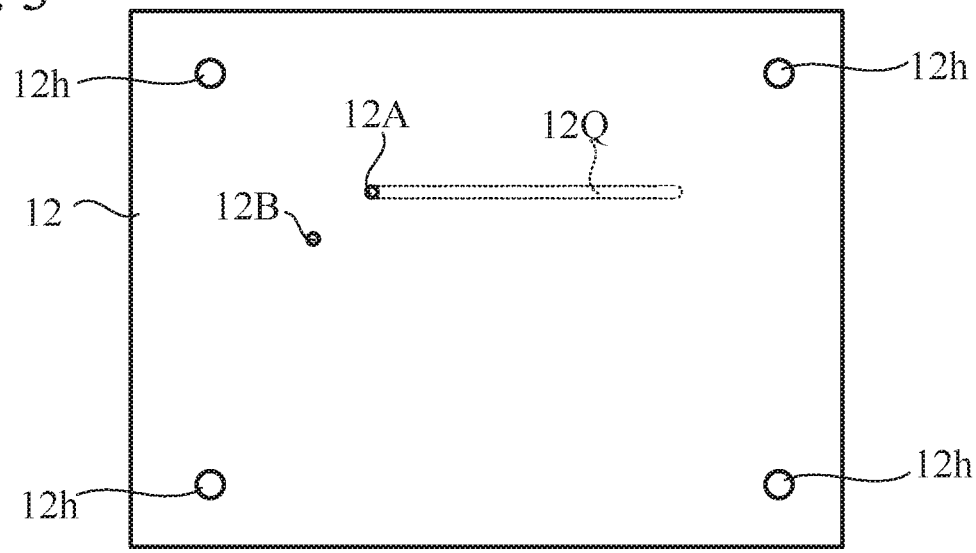
FIG. 3 is a plan view showing a flow passage plate of a microfluidic chip of the microfluidic device of FIG. 1.

As shown in FIGS. 1 to 3, in the flow passage plate 12 of the microfluidic chip 5, a recess 12Q that forms a flow passage 12P for liquid and a communication hole 12A communicating with one end of the recess 12Q are formed. The communication hole 12A is aligned with the through-hole 6A of the protection flat plate 6. A through-hole 12B is formed in the flow passage plate 12. The through-hole 12B is aligned with the through-hole 6B of the protection flat plate 6.

The flat plate 11 of the microfluidic chip 5 is stacked under the flow passage plate 12 to close the recess 12Q to define the flow passage 12P. In the flat plate 11, a communication through-hole 11A communicating with the other end of the recess 12Q, and a through-hole 11B aligned with the through-hole 12B of the flow passage plate 12, are formed.

As shown in FIGS. 1, 2, 4, and 5, in the flow passage plate 10 of the microfluidic chip 4, a recess 10Q that forms a flow passage 10P for liquid, and a communication hole 10B communicating with one end of the recess 10Q, are formed. The communication hole 10B is aligned with the through-hole 6B of the protection flat plate 6, the through-hole 12B of the flow passage plate 12, and the through-hole 11B of the flat plate 11. A through-hole 10A is formed in flow passage plate 10. The through-hole 10A is aligned with the communication through-hole 11A of the flat plate 11.

The flat plate 9 of the microfluidic chip 4 is stacked under the flow passage plate 10 to close the recess 10Q for defining the flow passage 10P. In the flat plate 9, a communication through-hole 9B communicating with the other end of the recess 10Q, and a through-hole 9A aligned with the through-hole 10A of the flow passage plate 10 are formed.

As shown in FIGS. 1, 2, 6, and 7, in the flow passage plate 8 of the microfluidic chip 3, a recess 8Q that forms a flow passage 8P for liquid, and communication holes 8A and 8B communicating with one end of the flow passage 8P, are formed. The communication hole 8A is aligned with the communication through-hole 11A of the flat plate 11, the through-hole 10A of the flow passage plate 10, and the through-hole 9A of the flat plate 9. The communication hole 8B is aligned with the communication through-hole 9B of the flat plate 9.

The flat plate 7 of the microfluidic chip 3 is stacked under the flow passage plate 8 to close the recess 8Q for defining the flow passage 8P. In the flat plate 7, a communication through-hole 7C communicating with the other end of the recess 8Q is formed.

In the supporting flat plate 2, a through-hole 2C aligned with the communication through-hole 7C of the flat plate 7 is formed. The communication through-hole 7C and the through-hole 2C are outlet ports for liquid in the microfluidic device 1. A liquid suction device 20C (e.g., a tube connected with a suction pump (not shown)) is, for example, connected with the through-hole 2C. However, the supporting flat plate 2 is not absolutely necessary.

In the above configuration, the liquid supplied from the injector 19A flows into the flow passage 8P through the through-hole 6A, the communication hole 12A, the flow passage 12P, the communication through-hole 11A, the through-hole 9A, and the communication hole 8A. The liquid supplied from the injector 19B flows into the flow passage 8P through the through-hole 6B, the through-hole 12B, the through-hole 11B, the communication hole 10B, the flow passage 10P, the communication through-hole 9B, and the communication hole 8B.

The two kinds of liquids merging together at the flow passage 8P are mixed in the flow passage 8P, and the reaction state occurring thereat is observed. In this embodiment, the flow passage plates 8, 10, and 12, the flat plates 9 and 11, and the protection flat plate 6 located above the flow passage 8P are made of transparent materials. In addition, as shown in FIG. 2, the flow passage 8P is located at a location that is different from the flow passages 10P and 12P when viewed from above. Thus, the reaction state of the liquids in the flow passage 8P can be easily observed from above by the human eye or using an optical instrument. In addition, since the flow passages 8P, 10P, and 12P are located at different positions from one another when viewed from above, the flow of liquid in any of the flow passages 8P, 10P, and 12P can be easily observed from above by the human eye or by using an optical instrument.

Figure 4:
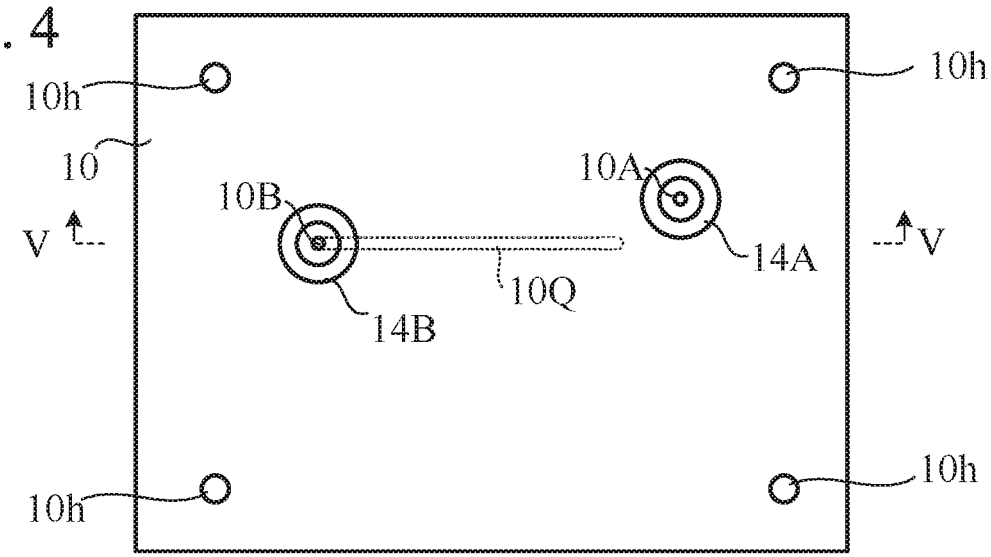
FIG. 4 is a plan view showing a flow passage plate of another microfluidic chip of the microfluidic device of FIG. 1.
Figure 5:
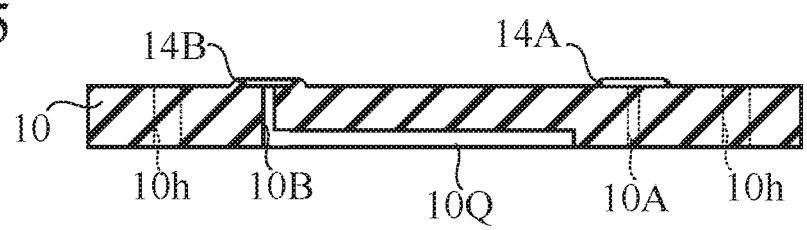
FIG. 5 is a cross-sectional view taken along line V-V in FIG. 4.

As shown in FIGS. 1, 4, and 5, annular seals 14A and 14B that are made of an elastomer are fixed to the upper surface of the flow passage plate 10 of the microfluidic chip 4 and surround the through-hole 10A and the communication hole 10B, respectively. The annular seals 14A and 14B are located on the upper surface of the flow passage plate 10, i.e., the surface that faces the flat plate 11 of the microfluidic chip 5, and the annular seals 14A and 14B are elastically deformed by compression between the flow passage plate 10 and the flat plate 11, so that leakage of liquid between the microfluidic chips 4 and 5 is prevented or reduced. In other words, the liquid flowing from the communication through-hole 11A to the through-hole TOA is surrounded by the annular seal 14A and leakage therefrom is prevented or reduced, whereas the liquid flowing from the communication through-hole 11B to the communication hole 10B is surrounded by the annular seal 14B and leakage therefrom is prevented or reduced.

The elastomer for making the annular seals 14A and 14B may be, for example, silicone rubber. In this embodiment, the annular seals 14A and 14B are made integrally with the flow passage plate 10.

Figure 6:
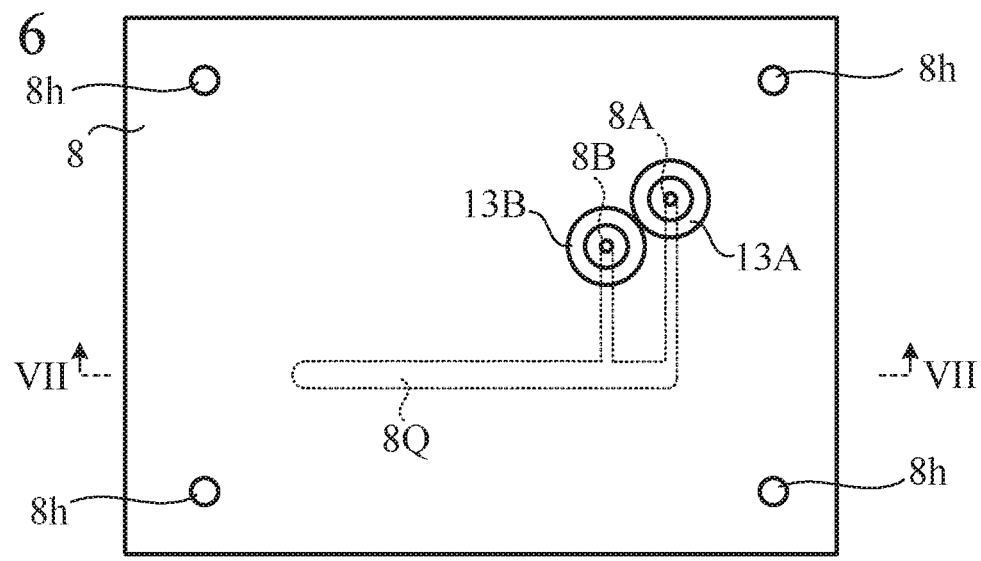
FIG. 6 is a plan view showing a flow passage plate of another microfluidic chip of the microfluidic device of FIG. 1.
Figure 7:
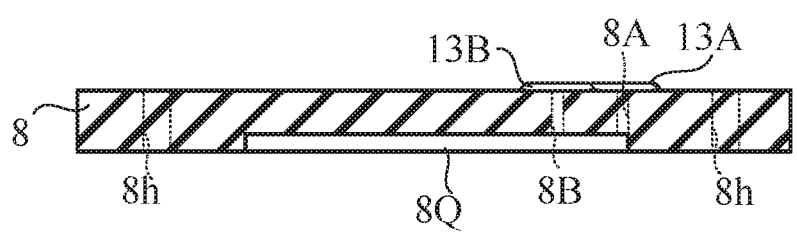
FIG. 7 is a cross-sectional view taken along line VII-VII in FIG. 6.

As shown in FIGS. 1, 6, and 7, annular seals 13A and 13B that are made of an elastomer are fixed to the upper surface of the flow passage plate 8 of the microfluidic chip 3 and surround the communication holes 8A and 8B, respectively. The annular seals 13A and 13B are located on the upper surface of the flow passage plate 8, i.e., the surface that faces the flat plate 9 of the microfluidic chip 4, and the annular seals 13A and 13B are elastically deformed by compression between the flow passage plate 8 and the flat plate 9, so that leakage of liquid between the microfluidic chips 3 and 4 is prevented or reduced. In other words, the liquid flowing from the through-hole 9A to the communication hole 8A is surrounded by the annular seal 13A and leakage therefrom is prevented or reduced, whereas the liquid flowing from the communication through-hole 9B to the communication hole 8B is surrounded by the annular seal 13B and leakage therefrom is prevented or reduced.

The elastomer for making the annular seals 13A and 13B may be, for example, silicone rubber. In this embodiment, the annular seals 13A and 13B are made integrally with the flow passage plate 8.

In this embodiment, the flow passage 8P of the microfluidic chip 3 is formed easily, without using a tube, by combining the flow passage plate 8 in which the recess 8Q forming the flow passage 8P for liquid and the communication holes 8A and 8B communicating with the recess 8Q are formed and the flat plate 7 in which the communication through-hole 7C communicating with the recess 8Q is formed. In addition, the flow passage 10P of the microfluidic chip 4 is formed easily, without using a tube, by combining the flow passage plate 10 in which the recess 10Q forming the flow passage 10P for liquid and the communication hole 10B communicating with the recess 10Q are formed and the flat plate 9 in which the communication through-hole 9B communicating with the recess 10Q is formed. Furthermore, the flow passage 12P of the microfluidic chip 5 is formed easily, without using a tube, by combining the flow passage plate 12 in which the recess 12Q forming the flow passage 12P for liquid and the communication hole 12A communicating with the recess 12Q are formed and the flat plate 11 in which the communication through-hole 11A communicating with the recess 12Q is formed.

In this embodiment, the microfluidic device 1 can be formed by stacking multiple microfluidic chips 3, 4, and 5, each having a different type of flow passage, one on top of another, and by aligning the communication hole or the communication through-hole of one microfluidic chip with the communication hole or the communication through-hole of a neighboring microfluidic chip. Here, "different type" means that at least one of the kind of liquid flowing through the flow passage, the shape, the position, and the dimensions of the flow passage, and the structures arranged in the flow passage is different.

By changing the laminated microfluidic chips depending on the application, a microfluidic device appropriate to the application can be formed easily. For example, in the above example, the microfluidic chip 5 is used for supplying a type of liquid, and the microfluidic chip 4 is used for passing the liquid and for supplying another kind of liquid, whereas the microfluidic chip 3 is used for mixing these liquids. However, another microfluidic device may be formed including a microfluidic chip for introducing two kinds of liquids, a microfluidic chip for mixing these liquids, a microfluidic chip for separating a necessary component from these liquids, and a microfluidic chip for analyzing the separated component. In this case, the microfluidic chip 3 for mixing liquids may be used for these two examples.

Accordingly, a satisfactory microfluidic device appropriate to the use can be formed by selecting microfluidic chips suitable for processes, even if the type of process using liquids, the order of processes, and the number of processes are changed.

In the formed microfluidic device, each of the microfluidic chips 3, 4, and 5 has a different type of flow passage 8P, 10P, or 12P and has a different function. In the formed microfluidic device, multiple flow passages 8P, 10P, and 12P arranged in three dimensions are provided, and these microfluidic chips are stacked in the same two-dimensional region, so that the area of the microfluidic device 1 can be limited.

In this embodiment, the microfluidic device 1 has a laminated structure including multiple plates stacked one on top of another. In this structure, elements made of elastomer reduce or prevent leakage of liquid from the pathway. Specifically, in the microfluidic chip 3, the flow passage plate 8 is made of a soft elastomer. Accordingly, it is easy to form the recess 8Q that forms the flow passage 8P, and when the stacked flow passage plate 8 and the flat plate 7 are compressed, the flat plate 8 adheres tightly to the flat plate 7 for reducing or preventing leakage of liquid therebetween. In the microfluidic chip 4, the flow passage plate 10 is made of a soft elastomer. Accordingly, it is easy to form the recess 10Q that forms the flow passage 10P, and when the stacked flow passage plate 10 and the flat plate 9 are compressed, the flow passage plate 10 adheres tightly to the flat plate 9 for reducing or preventing leakage of liquid therebetween. In the microfluidic chip 5, the flow passage plate 12 is made of a soft elastomer. Accordingly, it is easy to form the recess 12Q that forms the flow passage 12P, and when the stacked flow passage plate 12 and the flat plate 11 are compressed, the flow passage plate 12 adheres tightly to the flat plate 11 so as to reduce or prevent leakage of liquid therebetween. In addition, when the stacked flow passage plate 12 and the protection flat plate 6 are compressed, the flow passage plate 12 adheres tightly to the protection flat plate 6 to reduce or prevent leakage of liquid therebetween.

The annular seals 13A and 13B provided on the flow passage plate 8 of the microfluidic chip 3 are in contact with, and are compressed by, the flat plate 9 of the other microfluidic chip 4, and allow the flow of the fluid between the microfluidic chips 3 and 4 while preventing or reducing leakage of the fluid. The annular seals 14A and 14B provided on the flow passage plate 10 of the microfluidic chip 4 are in contact with and are compressed by the flat plate 11 of the other microfluidic chip 5, and allow the flow of the fluid between the microfluidic chips 4 and 5 while preventing or reducing leakage of the fluid. Accordingly, connectors for connecting the flow passages of multiple microfluidic chips are not necessary.

In this embodiment, the annular seals 13A and 13B are made integrally with the flow passage plate 8, whereas the annular seals 14A and 14B are made integrally with the flow passage plate 10. Accordingly, treatment of the microfluidic chips 3 and 4 is easy, and manufacturing of the microfluidic device 1 is also easy.

In this embodiment, in each plate 2, 6, 7, 8, 9, 10, 11, or 12, the fixing through-holes 2$h$, 6$h$, 7$h$, 8$h$, 9$h$, 10$h$, 11$h$, or 12$h$ is formed. When the microfluidic device 1 is constructed from the multiple microfluidic chips 3, 4, and 5, by inserting the multiple pins 16 into the fixing through-holes 2$h$, 6$h$, 7$h$, 8$h$, 9$h$, 10$h$, 11$h$, and 12$h$, multiple microfluidic chips 3, 4, and 5 can be easily positioned relative to one another, and the multiple microfluidic chips 3, 4, and 5 can be easily integrated by fixing tools, for example, the nuts 18.

As described above, in the laminated structure, elements made of elastomer reduce or prevent leakage of liquid from the pathway. The fixing tools, for example, nuts 18 attached to the pins 16, compress and elastically deform the elastomer elements for enhancing the sealing capability thereof. However, if necessary, the plates may be joined together using an adhesive, a chemical reaction, or a thermal reaction.

Next, the method for producing the microfluidic device 1 according to this embodiment will be described. The following manufacturing method is an example, and the microfluidic device 1 may be manufactured by another method.

First, the method for producing a mold for manufacturing the flow passage plate 10 of the microfluidic chip 4 will be described. The flow passage plates 8, 12, etc. can be manufactured by a similar process.

Figure 8:
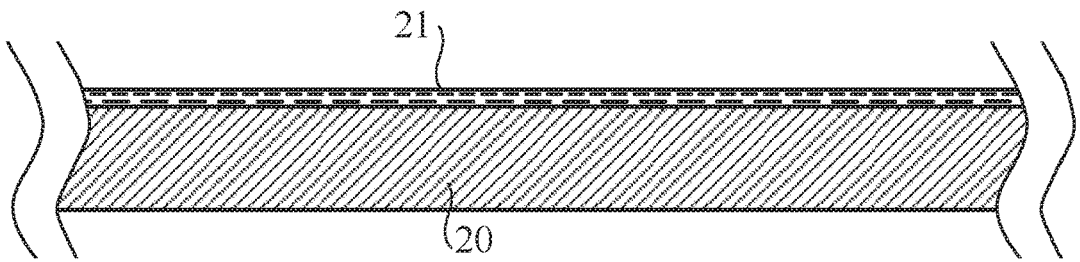
FIG. 8 is a schematic view showing a producing step of a mold for producing the flow passage plate in FIG. 5.

As shown in FIG. 8, an epoxy resin solution 21 was dropped onto a P-type silicon wafer 20 with crystal orientation <100>, and was made uniform by spin coating. As the epoxy resin solution 21, a negative photoresist manufactured by Nippon Kayaku Co., Ltd. (trade name "SU8 3050") was used. Spin coating was carried out at 2000 rpm for 30 seconds.

Figure 9:
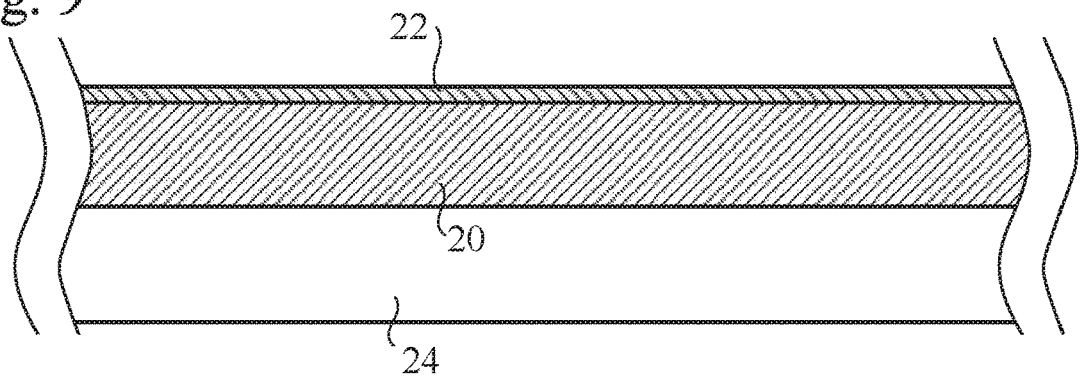
FIG. 9 is a schematic view showing a producing step after the step of FIG. 8.
Figure 10:
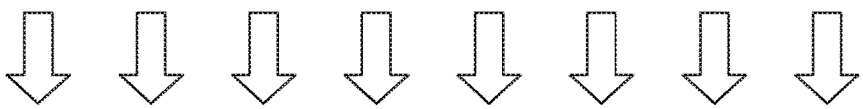
FIG. 10 is a schematic view showing a producing step after the step of FIG. 9.
Figure 10:
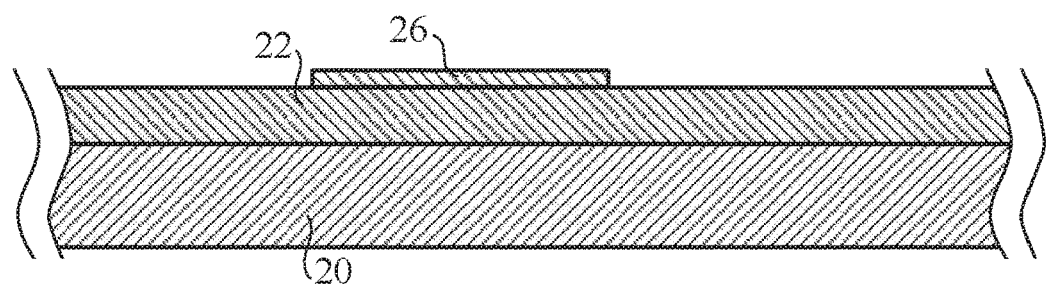

Then, in order to dry the solvent of the epoxy resin solution 21, as shown in FIG. 9, pre-baking was carried out for 25 minutes at a temperature of 95 degrees Celsius by means of a heater 24 to form a dried epoxy resin layer 22. After that, as shown in FIG. 10, a mask 26 was placed on the epoxy resin layer 22, and the epoxy resin layer 22 was irradiated with ultraviolet light by the use of a mercury lamp to harden a desired portion of the epoxy resin layer 22. The mask 26 is used to form a part in the mold corresponding to the recess 10Q of the flow passage plate 10, and has the same size and the same shape as the recess 10Q.

Figure 11:
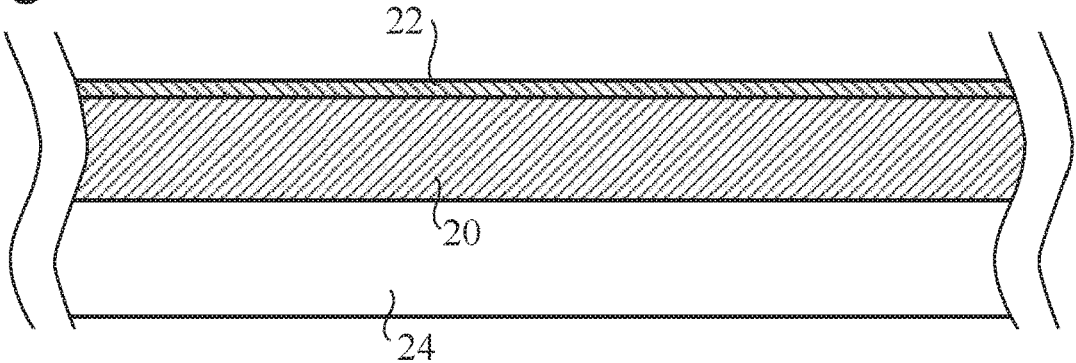
FIG. 11 is a schematic view showing a producing step after the step of FIG. 10.
Figure 12:
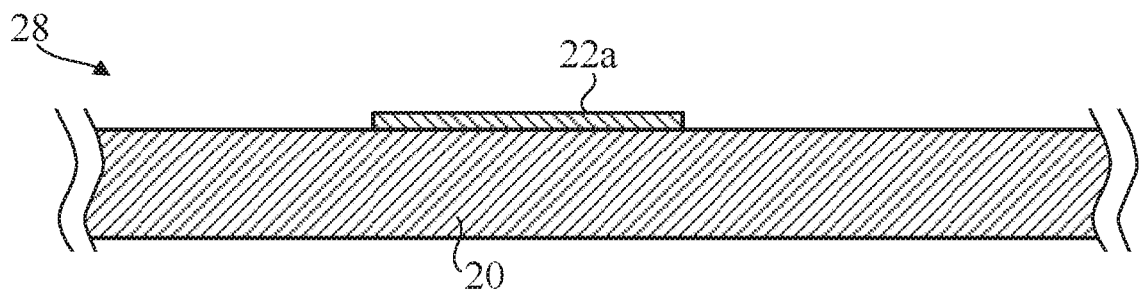
FIG. 12 is a schematic view showing the produced mold.

Then, in order to complete the polymerization reaction of epoxy resin, baking was carried out for 5 minutes at a temperature of 95 degrees Celsius using the heater 24 as shown in FIG. 11. After that, the portion that was not in contact with the mask 26 and was not hardened was removed by a developer (trade name "ST8 developer") to form a remaining resin protrusion 22$a$ corresponding to the recess 10Q as shown in FIG. 12. Then, the silicon wafer 20 was cleaned with isopropyl alcohol, resulting in that a mold 28 having the silicon wafer 20 and the remaining resin protrusion 22$a$ was completed.

Figure 13:
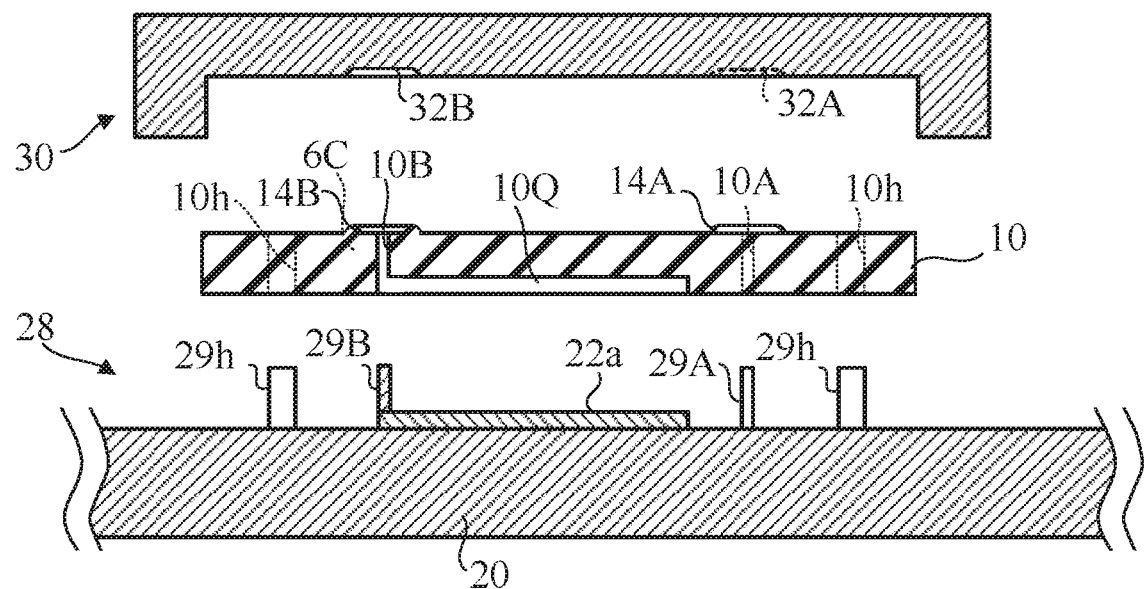
FIG. 13 is a schematic view showing a producing step of the flow passage plate with the use of the mold.

Then, as shown in FIG. 13, pins 29$a$, 29$b$, and 29$h$ were joined to the mold 28. The pins 29$a$ and 29$b$ correspond to the through-hole 10A and the communication hole 10B of the flow passage plate 10, respectively, whereas the pins 29$h$ correspond to the fixing through-holes 10$h$ of the flow passage plate 10, respectively.

Another mold 30, having recesses 32A and 32B, was prepared. The recesses 32A and 32B correspond to the annular seals 14A and 14B, respectively. The molds 28 and 30 were immersed in a releasing agent (trade name "NOX FREE F-350") manufactured by Unimatec Co., Ltd. for one minute and then sufficiently dried. Next, a silicone rubber (trade name "SILPOT 184" manufactured by Dow Corning Toray Co., Ltd.) was injected into the space in the molds 28 and 30, and held at a temperature of 100 degrees Celsius for 0.5 hours to cure the silicone rubber. Thereafter, the cured silicone rubber was peeled off from the molds 28 and 30 to obtain the flow passage plate 10 made of the silicone rubber to which the shapes of the molds 28 and 30 were transferred. However, the through-hole 10A, the communication hole 10B, and the fixing through-holes 10$h$ may be formed after molding of the flow passage plate 10.

Figure 14:
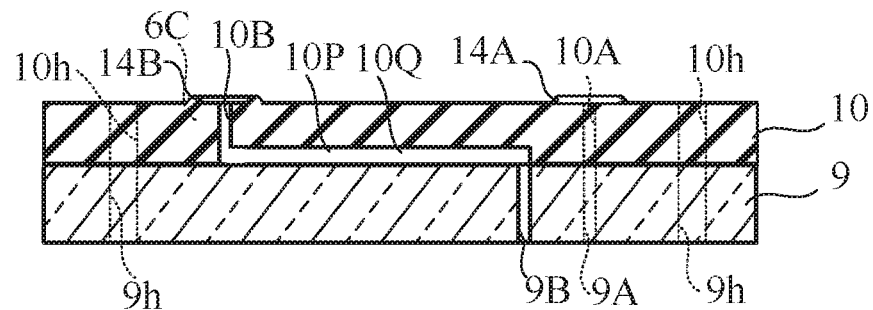
FIG. 14 is a schematic view showing a step of sticking the flow passage plate on a flat plate.

Furthermore, as shown in FIG. 14, the flat plate 9 made of glass in which the through-holes 9A and 9B and the fixing through-holes 9$h$ were formed was joined to the flow passage plate 10. However, bonding of the flat plate 9 and the flow passage plate 10 is not absolutely necessary. It might be preferable not to join them because it would be easier to clean, wash, or dry the flow passage 10P when removing the microfluidic chip 4 from the pins 16.

Thus, the microfluidic chips 3, 4, and 5 were prepared, and then the supporting flat plate 2, the microfluidic chips 3, 4, and 5, and the protection flat plate 6 were stacked one on top of another. Next, by inserting multiple pins 16 through the fixing through-holes 2h, 6h, 7h, 8h, 9h, 10h, 11h, and 12h, the positions of the plates were aligned. Furthermore, by means of the nuts 18, the plates were secured and the flow passage plates 8, 10, and 12, and the annular seals 13A, 13B, 14A, and 14B were compressed adequately for sealing the pathway of fluid.

Although the present invention has been described, the foregoing description is not intended to limit the present invention. Various modifications including one or more deletions, additions, and substitutions of structural elements may be made within the scope of the present invention.

For example, in the above-described embodiment, the annular seals 13A and 13B are made integrally with the flow passage plate 8, whereas the annular seals 14A and 14B are made integrally with the flow passage plate 10. However, the annular seals may be joined to the flow passage plate using an adhesive, a chemical reaction, or a thermal reaction.

Figure 15:
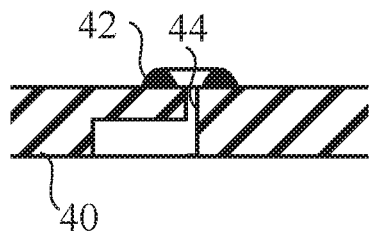
FIG. 15 is a cross-sectional view of a flow passage plate and an annular seal according to a modification.
Figure 16:
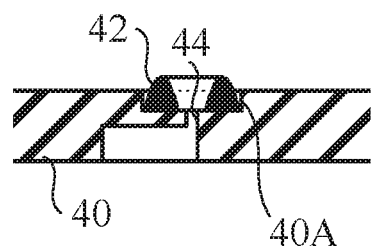
FIG. 16 is a cross-sectional view of a flow passage plate and an annular seal according to another modification.

The annular seals may be separable from the flow passage plate. FIG. 15 shows an annular seal 42 separable from the flow passage plate 40. The annular seal 42 is located so as to be in contact with the upper surface of the flow passage plate 40, and surrounds a hole 44 of the flow passage plate 40. The annular seal 42 is located between the lower surface of another microfluidic chip and the upper surface of the flow passage plate 40, and is compressed therebetween to be elastically deformed for preventing or reducing leakage of the fluid to the outside. An annular seal, such as an O-ring or a D-ring, may be used as the annular seal 42. As shown in FIG. 16, a recess 40A that may be used for the seat of the annular seal 42 may be formed on the upper surface of the flow passage plate 40.

In a case in which the annular seals are separable from the flow passage plate, it is unnecessary to form the flow passage plate of an elastomer. For example, it may be made of glass or a transparent resin.

In the above-described embodiment, in each microfluidic chip, the flow passage plate is located above the flat plate, but the arrangement may be reversed.

Figure 17:
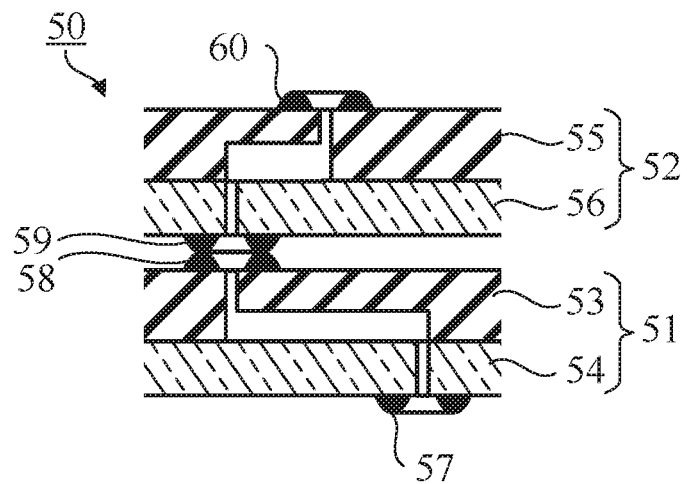
FIG. 17 is a cross-sectional view showing a part of a microfluidic device according to another modification.

In the above-described embodiment, the annular seals are provided on the flow passage plate of the microfluidic chip. Instead of, or in addition to this, annular seals may be provided on the flat plate of the microfluidic chip. In the above-described embodiment, the annular seals are provided on the plate of the microfluidic chip in which the liquid introduction ports for liquid are formed. Instead of, or in addition to this, annular seals may be provided on the plate in which outlet ports for liquid are formed. FIG. 17 shows a microfluidic device 50 according to a variation in which annular seals are located on the upper and lower surfaces of each microfluidic chip, respectively. The microfluidic device 50 includes microfluidic chips 51 and 52, the microfluidic chip 51 including a flow passage plate 53 and a flat plate 54, the microfluidic chip 52 including a flow passage plate 55 and a flat plate 56. An annular seal 57 is located on the lower surface of the flat plate 54, whereas an annular seal 58 is located on the upper surface of the flow passage plate 53. An annular seal 59 is located on the lower surface of the flat plate 56, whereas an annular seal 60 is located on the upper surface of the flow passage plate 55. The annular seals 58 and 59 are in contact with each other and are compressed between the flow passage plate 53 of the microfluidic chip 51 and the flat plate 56 of the microfluidic chip 52 so as to be deformed for preventing or reducing leakage of fluid to the outside. In the flow passage plates 53 and 55 and the flat plates 54 and 56, recesses that may be used as seats for the annular seals may be formed.

In the above-described embodiment, no annular seals are located between the flow passage plate 12 of the microfluidic chip 5 and the protection flat plate 6, but annular seals may be located therebetween. In the above-described embodiment, no annular seals are located between the supporting flat plate 2 and the flat plate 7 of the microfluidic chip 3, but annular seals may be located therebetween.

Figure 18:
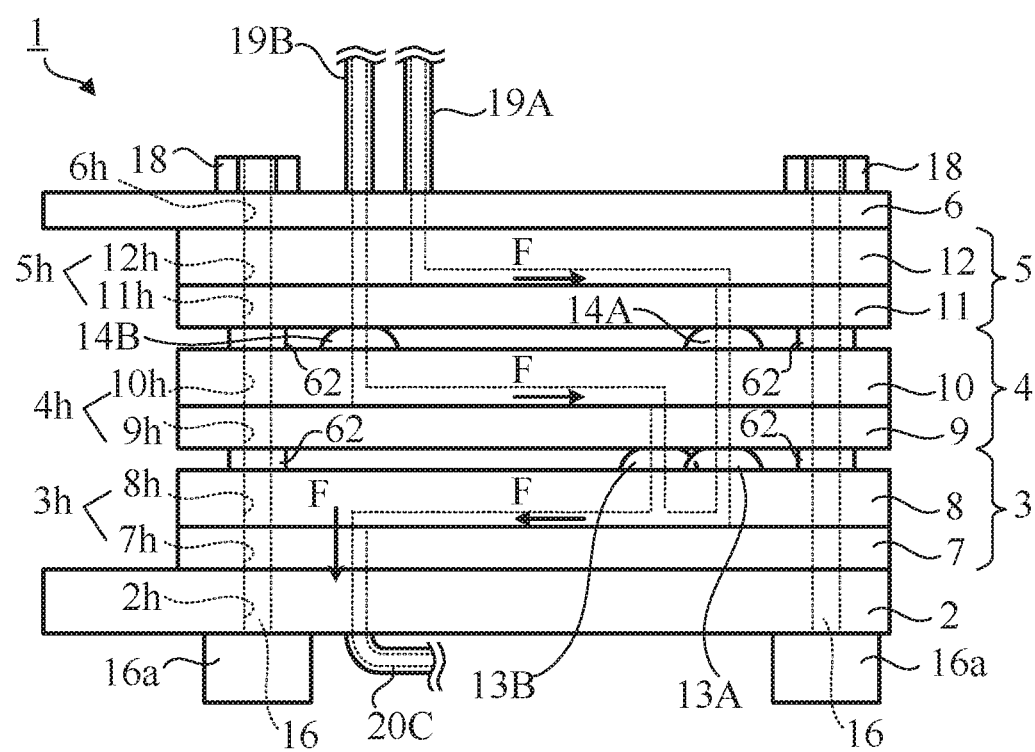
FIG. 18 is a front view showing a microfluidic device according to another modification.

As described above, each annular seal is compressed between plates and reduced in the thickness direction thereof. However, it is likely that the plate is located above an annular seal, and that this fluidic chip cannot be oriented horizontally. For example, such concerns may arise in a case in which there are only one of two annular seals in a layer, or the gap between annular seals in a layer is small. Accordingly, as necessary, preferably, three or more spacers may be placed in the same layer as the annular seals. These spacers have the same height as one another, this height being less than the height of the annular seals in the uncompressed state and being equivalent to the desired height of the annular seal when compressed. FIG. 18 shows an example of microfluidic device 1 in which spacers 62 are provided. In this example, multiple spacers 62 are arranged in the layer between the flow passage plate 8 and the flat plate 9, and multiple spacers 62 are also arranged between the flow passage plate 10 and the flat plate 11. In this example, each spacer 62 is a ring arranged around a pin 16, and four spacers 62 are provided in one layer. However, the spacers do not have to have the shape of ring, and they need not be arranged around the pins 16 if the spacers are arranged at a sufficient distance from each other.

Aspects of the present invention are also set out in the following numbered clauses:

Clause 1. A microfluidic chip comprising:
a flow passage plate in which a recess forming a flow passage for liquid and a communication hole communicating with the recess are formed;
a flat plate stacked on or under the flow passage plate to close the recess for defining the flow passage, a communication through-hole communicating with the recess is formed in the flat plate; and
an annular seal made of an elastomer located on, or limited on, an outer surface of at least one of the flow passage plate and the flat plate, the annular seal surrounding at least one of the communication hole and the communication through-hole.

Clause 2. The microfluidic chip according to clause 1, wherein at least one of the flow passage plate and the flat plate is made of the elastomer and formed integrally with the annular seal.

In this case, since the annular seal is integral with at least one of the flow passage plate and the flat plate, treatment of the microfluidic chip is easy, and manufacturing of the microfluidic device is also easy.

Clause 3. The microfluidic chip according to clause 1 or 2, wherein multiple fixing through-holes are formed in the flow passage plate, and wherein multiple fixing through-holes that are aligned with the multiple fixing through-holes of the flow passage plate, respectively, are formed in the flat plate.

In this case, when the microfluidic device is constructed with multiple microfluidic chips, by inserting the multiple pins into the fixing through-holes of the flow passage plate and the flat plate, multiple microfluidic chips can be easily positioned relative to each other, and the multiple microfluidic chips can be easily integrated by using fixing tools.

Clause 4. The microfluidic chip according to any one of clauses 1 to 3, wherein at least one of the flow passage plate and the flat plate is transparent.

In this case, the state of liquid in the flow passage can be easily observed by the human eye or by an optical instrument.

Clause 5. A microfluidic device comprising:
multiple microfluidic chips according to any one of clauses 1 to 4, the microfluidic chips comprising the flow passages of different types, respectively,
the multiple microfluidic chips stacked one on top of another, such that the communication hole or the communication through-hole of one of the microfluidic chips is aligned with the communication hole or the communication through-hole of a neighboring microfluidic chip.

Clause 6. The microfluidic device according to clause 5, wherein the flow passages of the multiple microfluidic chips are located at different positions from each other when viewed from above.

In this case, the state of liquid in multiple flow passages can be easily observed by the human eye or by an optical instrument.

REFERENCE SYMBOLS 1, 50: Microfluidic Device
2: Supporting Flat Plate
2C: Through-Hole
3, 4, 5, 51, 52: Microfluidic Chip
6: Protection Flat Plate
6a, 6b: Through-Hole
7, 9, 11, 54, 56: Flat Plate
8, 10, 12, 40, 53, 55: Flow Passage Plate
2h, 3h, 4h, 5h, 6h, 7h, 8h, 9h, 10h, 11h, 12h: Fixing Through-Hole
16: Pin
18: Nut 18 (Fixing Tool)
8P, 10P, 12P: Flow Passage
8Q, 10Q, 12Q: Recess
7C, 9B, 11A: Communication Through-hole
8A, 8B, 10B, 112A: Communication Hole
9A, 10A, 11B, 12B: Through-Hole
13A, 13B, 14A, 14B, 42, 57, 58, 59, 60: Annular Seal

The invention claimed is:
1. A microfluidic chip, comprising:
a flow passage plate having a first surface on which a recess forms a flow passage for liquid, a second surface opposite to the first surface, and a communication hole communicating with the recess;
a flat plate stacked on or under the flow passage plate, the flat plate having a third surface that is adhered to the first surface of the flow passage plate to close the recess for defining the flow passage, a fourth surface opposite to the third surface, and a communication through-hole communicating with the recess; and
an annular seal made of an elastomer formed on and protruding from at least one of the second surface of the flow passage plate and the fourth surface of the flat plate, the annular seal surrounding at least one of the communication hole of the flow passage plate and the communication through-hole of the flat plate,
wherein at least one of the flow passage plate and the flat plate is made of the elastomer and formed integrally with the annular seal.

2. The microfluidic chip according to claim 1, wherein the flow passage plate has multiple first fixing through-holes formed therein, and wherein the flat plate has multiple second fixing through-holes formed therein, the first fixing through-holes being aligned with the second fixing through-holes, respectively; and
pins inserted through the multiple first fixing through-holes and the multiple second fixing through-holes so as to fasten the flat plate and the flow passage plate together.

3. A microfluidic device comprising:
multiple microfluidic chips according to claim 1, the microfluidic chips having the flow passages of different types, respectively,
the multiple microfluidic chips stacked one on top of another, such that the communication hole or the communication through-hole of one of the microfluidic chips is aligned with the communication hole or the communication through-hole of a neighboring microfluidic chip,
wherein the annular seal of one of the microfluidic chips are compressed between the microfluidic chips and surrounds the communication hole and the communication through-hole of the microfluidic chips.

4. The microfluidic device according to claim 3, wherein the flow passage plate in each of the microfluidic chips has first fixing through-holes formed therein, wherein the flat plate of each of the microfluidic chips has second fixing through-holes formed therein, and wherein the first fixing through-holes are aligned with the second fixing through-holes in all the microfluidic chips; and
pins inserted through the first fixing through-holes and the second fixing through-holes so as to fasten the flat plate and the flow passage plate together.

5. A microfluidic chip, comprising:
a flow passage plate having a first surface on which a recess forms a flow passage for liquid, a second surface opposite to the first surface, and a communication hole communicating with the recess;
a flat plate stacked on or under the flow passage plate, the flat plate having a third surface that is adhered to the first surface of the flow passage plate to close the recess for defining the flow passage, a fourth surface opposite to the third surface, and a communication through-hole communicating with the recess; and
an annular seal made of an elastomer formed on at least one of the second surface of the flow passage plate and the fourth surface of the flat plate, the annular seal surrounding at least one of the communication hole of the flow passage plate and the communication through-hole of the flat plate,
wherein at least one of the flow passage plate and the flat plate is made of the elastomer and formed integrally with the annular seal;
the microfluidic chip includes multiple microfluidic chips:
the microfluidic chips having the flow passages of different types, respectively,
the multiple microfluidic chips stacked one on top of another, such that the communication hole or the communication through-hole of one of the microfluidic chips is aligned with the communication hole or the communication through-hole of a neighboring microfluidic chip,
wherein the annular seal of one of the microfluidic chips are compressed between the microfluidic chips and surrounds the communication hole and the communication through-hole of the microfluidic chips, and wherein the flow passage plate in each of the microfluidic chips are made of a transparent material, wherein the flat plate of each of the microfluidic chips are made of a transparent material, and wherein the flow passages of the multiple microfluidic chips are located at different positions from each other when viewed in a direction perpendicular to the first surface of the flow passage plate.

* * * * *